United States Patent
Le Bars et al.

(10) Patent No.: US 9,614,116 B2
(45) Date of Patent: Apr. 4, 2017

(54) IMPEDANCE ADAPTATION IN A THZ DETECTOR

(71) Applicant: CANON KABUSHIKI KAISHA, Tokyo (JP)

(72) Inventors: Philippe Le Bars, Thorigne Fouillard (FR); Walaa Sahyoun, Rennes (FR); Wojciech Knap, Saint-Gely-du-Fesc (FR); Nina Diakonova, Montpellier (FR); Dominique Coquillat, Prades-le-Lez (FR)

(73) Assignee: Canon Kabushiki Kaisha, Tokyo (JP)

(*) Notice: Subject to any disclaimer, the term of this patent is extended or adjusted under 35 U.S.C. 154(b) by 34 days.

(21) Appl. No.: 14/735,372

(22) Filed: Jun. 10, 2015

(65) Prior Publication Data
US 2015/0364508 A1    Dec. 17, 2015

(30) Foreign Application Priority Data
Jun. 13, 2014   (GB) ................................. 1410640.5

(51) Int. Cl.
*H01L 31/09*    (2006.01)
*H01L 31/113*    (2006.01)
*H01L 27/14*    (2006.01)

(52) U.S. Cl.
CPC .......... *H01L 31/1136* (2013.01); *H01L 27/14* (2013.01); *H01L 31/09* (2013.01); *Y02P 70/521* (2015.11)

(58) Field of Classification Search
CPC ....... H01L 23/66; H01L 31/1136; H01L 31/09
(Continued)

(56) References Cited

U.S. PATENT DOCUMENTS

| 2005/0088344 A1* | 4/2005 | Saitou | H01Q 1/38 343/700 MS |
| 2005/0107062 A1* | 5/2005 | Miyagi | H04B 1/28 455/323 |

(Continued)

FOREIGN PATENT DOCUMENTS

JP    2010135520 A    6/2010

OTHER PUBLICATIONS

GB Patent Application No. 1410640.5, Combined Search and Examination Report under Sections 17 and 18(3), dated Nov. 28, 2014.
Blin, et al., "Plasma-Wave Detectors for Terahertz Wireless Communication", IEEE Electron Device Letters, vol. 33, N. 10, Oct. 2012.
Öjefors, Erik, et al., "A 0.65 THz Focal-Plane Array in a Quarter-Micron CMOS Process Technology", IEEE Journal of Solid-State Circuits, vol. 44, No. 7, Jul. 2009.
(Continued)

*Primary Examiner* — Yara B Green
(74) *Attorney, Agent, or Firm* — Canon USA, Inc. I.P. Division

(57) ABSTRACT

At least one electronic device, system and method of manufacturing an electromagnetic wave detector are provided herein. The electronic device for receiving at least one electromagnetic wave of a given frequency may comprise at least one first field effect transistor, and at least one antenna configured to receive the at least one electromagnetic wave and connected to a gate of the at least one first field effect transistor, wherein a length of the gate is in a same order of magnitude as an oscillation length of an oscillation regime of the at least one first field effect transistor at the given frequency, and a width of the gate is such that an impedance presented by the at least one first field effect transistor in the oscillation regime is adapted to an impedance of the at least one antenna.

16 Claims, 11 Drawing Sheets

(58) Field of Classification Search
USPC .......................................................... 257/290
See application file for complete search history.

(56) References Cited

U.S. PATENT DOCUMENTS

| | | | |
|---|---|---|---|
| 2011/0001173 A1 | 1/2011 | Öjefors et al. | |
| 2013/0175661 A1* | 7/2013 | Cai ................... | H01L 21/76232 257/506 |
| 2014/0375512 A1* | 12/2014 | Knap ................... | G01J 3/42 343/703 |
| 2016/0013409 A1* | 1/2016 | Burenkov ............. | H01L 49/006 250/504 R |

OTHER PUBLICATIONS

Nahar, Shamsun, et al.; "Terahertz Detection using on chip Patch and Dipole Antenna-Coupled GaAs High Electron Mobility Transistors"; IEEE; 2014; pp. 1-4.

Evangelisti, F.; "Terahertz electrodynamics in high electron-mobility transistors"; Journal of Applied Physics; vol. 114; Nr 12; Sep. 28, 2013; ISSN 0021-8979, pp. 124506-1 to 124506-9.

Gutin, Alexey, et al.; "Modeling Terahertz Plasmonic Si FETs With SPICE"; IEEE Transactions on Terahertz Science and Technology; vol. 3; Nr 5; Sep. 2013; pp. 545-549; IEEE; ISSN 2156-342X.

Schuster, F., et al.; "Imaging above 1 THz Limit with Si-MOSFET detectors"; Infrared Millimeter and Terahertz Waves; 2010 35th International Conference on; Sep. 5, 2010; ISBN 978-1-4244-6655-9; ISBN 1-4244-6655-5 (two pages).

* cited by examiner

IMPEDANCE ADAPTATION IN A THZ DETECTOR

PRIORITY CLAIM/INCORPORATION BY REFERENCE

This application claims the benefit under 35 U.S.C. §119 (a)-(d) of United Kingdom Patent Application No. 1410640.5, filed on Jun. 13, 2014, and entitled "Impedance adaptation in a THz detector", which application is hereby incorporated by reference herein in its entirety.

FIELD OF THE INVENTION

The present invention relates to the field of integrated circuits for electromagnetic waves detection. In particular, the present invention relates to the detection of high frequency electromagnetic waves (e.g. above 100 GHz and below 3 THz) for signal processing.

The invention may have applications notably in imaging systems and wireless telecommunications.

BACKGROUND OF THE INVENTION

Field Effect Transistors (FET) can be used as high frequency electromagnetic waves detectors. At the interface between the layers of a FET, notably between the metal and semiconductor layers, the crystal structure of the semiconductor material shows defects and irregularities in which results mobility of charge carriers.

At the interface, the tightness of the bounds between the atoms and the electrons is weaker. Thus, the mobility of the charge carriers is greater.

The resulting mobility of the charge carriers is referred to as "gas of carriers" or "plasma". The oscillations that can appear within the plasma are referred to as "plasmons".

When a high frequency electromagnetic wave reaches a FET, a voltage may appear between the source and the gate (or the drain and the gate) of the transistor. The voltage appears when the gate shows asymmetry as compared to the source (or the drain), i.e. when the gate is not at the same electrical potential as the source (or drain). This results in a voltage appearing between the two nodes which is proportional to the power of the incoming electromagnetic wave, as the result of the charge carriers over the channel resistance.

Detection of electromagnetic terahertz waves by FETs has been used in the field of spectroscopy for the reason that terahertz waves well penetrate some materials. Document Knap et al. "*Field Effect Transistors for Terahertz Detection: Physics and First Imaging Applications*" (Journal of Infrared, Millimeter, and Terahertz Waves, December 2009, Volume 30, Issue 12, pp 1319-1337) provides a review of the theory and experimentations that have been conducted for spectroscopy so far.

However such applications only aim at obtaining a DC voltage between drain and source when the FET is illuminated by electromagnetic waves. The techniques used are not convenient for transmitting data.

High frequencies are generally underused whereas they provide a large bandwidth modulation potential. Indeed, the ratio between the carrier frequency and the modulation bandwidth is easier to optimize when comprised between 10 and 100. For example, a 300 GHz carrier should provide a 30 GHz modulation bandwidth. The prior art techniques do not provide such modulation bandwidth. Document Blin et al. "*Plasma Waves Detectors for Terahertz Wireless Communications*" (IEEE electron device letters, vol. 33, N10, October 2012) discloses the first experiment that has been conducted for determining the modulation bandwidth achievable at room temperature with a FET. A modulation bandwidth of 8 GHz has been attained.

Document Ojefors et al. "*A 0.65 thz FOCAL PLANE Array In a Quarter Micron CMOS Process technology*" (IEEE Journal of Solid State Circuits, Vol. 44, No 7, July 2009) discloses the use of a FET operated at zero DC drain voltage. The FET behaves as a resistive mixer with a high linear resistance. Self-mixing is achieved by inserting a capacitor between the gate and the drain of the FET. The gate is biased through the use of the virtual ground of the receiving antenna. It is to be reminded that a virtual ground is a node of a circuit where the alternative currents cancel each another.

However, while the arrangement disclosed is convenient for spectroscopy, it cannot be used in communication applications.

Also, the transistor cannot be used with an optimal bias. Therefore the conversion of the terahertz power into voltage may not be optimal.

Another drawback is that the transistor behaves as a passive mixer. There is no amplification performed.

Another drawback is that adding some conducting element to the virtual ground of the antenna to bias the gate modifies the geometry of the antenna, and further modifies its electrical characteristics. For an antenna of small dimensions adapted to terahertz frequencies, the size of the conducting element surface is comparable to the size of the antenna surface. This renders the design of the antenna impractical.

The capacitor inserted alleviates the modulation bandwidth of the terahertz carrier.

Thus, there is a need for enhanced FET-based detectors that can be used in the wireless communication field.

The present inventors have already disclosed in patent application GB 1313912.6, a detector comprising an antenna and a FET transistor. The gate of the transistor is connected to a virtual mass in order to obtain a desired polarization of the transistor gate.

The inventors have now provided enhancements to the detector by coming up with a particular design of the transistor that makes it possible to obtain optimal adaptation between the antenna and the transistor.

SUMMARY OF THE INVENTION

According to a first aspect of the invention there is provided an electronic device for receiving at least one electromagnetic wave of a given frequency, the electronic device comprising: at least one first field effect transistor, and at least one antenna configured to receive the at least one electromagnetic wave and connected to a gate of the at least one first field effect transistor, wherein a length of the gate is in a same order of magnitude as an oscillation length of an oscillation regime of the at least one first field effect transistor at the given frequency, and a width of the gate is such that an impedance presented by the at least one first field effect transistor in the oscillation regime is adapted to an impedance of the at least one antenna.

In a device according to the first aspect, the impedances of the at least one antenna and the at least one first field effect transistor can be adapted without needing additional elements.

The device is simpler with enhanced performance.

Contrary to the prior art, wherein the antenna's impedance is usually adapted using a dedicated circuitry, the inventors have come up with a new design for the transistor that takes into account impedance adaptation so that such additional circuitry may be avoided.

The electronic device may be referred to as an electromagnetic wave detector.

It is considered that the length of the gate is in a same order of magnitude as the oscillation length when one ratio between these lengths is less than ten. For example the ratio of the gate's length on the oscillation length is less than 10.

According to embodiments, the at least one first field effect transistor may be a plasmonic transistor, and the oscillation regime of the at least one first field effect transistor corresponds to the plasma movements.

For example, the length of the gate is above the oscillation length.

According to embodiments, the length of the gate minimizes a variation of a photoresponse of the at least one first field effect transistor.

For example, the variation may be below 50%.

According to embodiments, the impedance may be set to a minimum value in order to maximise a working frequency bandwidth of the electronic device and in order to minimize a signal to noise ratio of the electronic device.

For example, the electronic device may further comprise at least one other second field effect transistor, a length of a gate of the at least one other second field effect transistor being below the length of the gate of the at least one first field effect transistor.

According to embodiments, a source of the at least one first field effect transistor may be grounded.

In one or more embodiments, the electronic device may further comprise a plurality of the at least one first field effect transistors connected in parallel.

According to embodiments, the plurality of the at least one first field effect transistors may be double gate transistors.

In one or more further embodiments, the electronic device may further include a low noise amplifier connected to the at least one first field effect transistor.

According to embodiments, the low noise amplifier may present an input capacitance and the value of the impedance presented by the at least one first field effect transistor may be such that a cut-off frequency of a low-pass filter formed at least by the impedance and the capacitance is above working frequencies of the electronic device.

For example, in one or more embodiments, the low noise amplifier may be connected to a drain of the at least one first field effect transistor.

According to a second aspect of the invention there is provided a demodulation system comprising: an electronic device for receiving at least one electromagnetic wave of a given frequency, the electronic device comprising: at least one first field effect transistor, and at least one antenna configured to receive the at least one electromagnetic wave and connected to a gate of the at least one first field effect transistor, wherein a length of the gate is in a same order of magnitude as an oscillation length of an oscillation regime of the at least one first field effect transistor at the given frequency, and a width of the gate is such that an impedance presented by the at least one first field effect transistor in the oscillation regime is adapted to an impedance of the at least one antenna; and a demodulator for demodulating the at least one electromagnetic wave.

For example, in one or more embodiments, the demodulator may be connected to a low noise amplifier connected to the at least one first field effect transistor.

According to a third aspect of the invention there is provided a method of manufacturing an electromagnetic wave detector device, the method comprising: determining at least one working frequency for the electromagnetic wave detector device, determining an oscillation length of an oscillation regime at the at least one working frequency of at least one transistor to be integrated in the electromagnetic wave detector device, determining an antenna impedance of at least one antenna to be integrated in the electromagnetic wave detector device, disposing at least one antenna layer in an integrated circuit in order to form the at least one antenna to be integrated in the electromagnetic wave detector device, disposing at least one gate layer of the at least one transistor to be integrated in the electromagnetic wave detector device, wherein a length of a gate of the at least one transistor is in a same order of magnitude as the oscillation length and a width of the gate such that an impedance presented by the at least one transistor in the oscillation regime is adapted to the antenna impedance of the at least one antenna, and connecting the at least one antenna layer to the at least one gate layer.

The objects according to the second and third aspects of the invention provide at least the same advantages as those provided by the detector according to the first aspect.

BRIEF DESCRIPTION OF THE DRAWINGS

The features and advantages of the invention will become apparent from the following description of non-limiting exemplary embodiments, with reference to the appended drawings, in which.

DETAILED DESCRIPTION OF THE INVENTION

Figure 1:
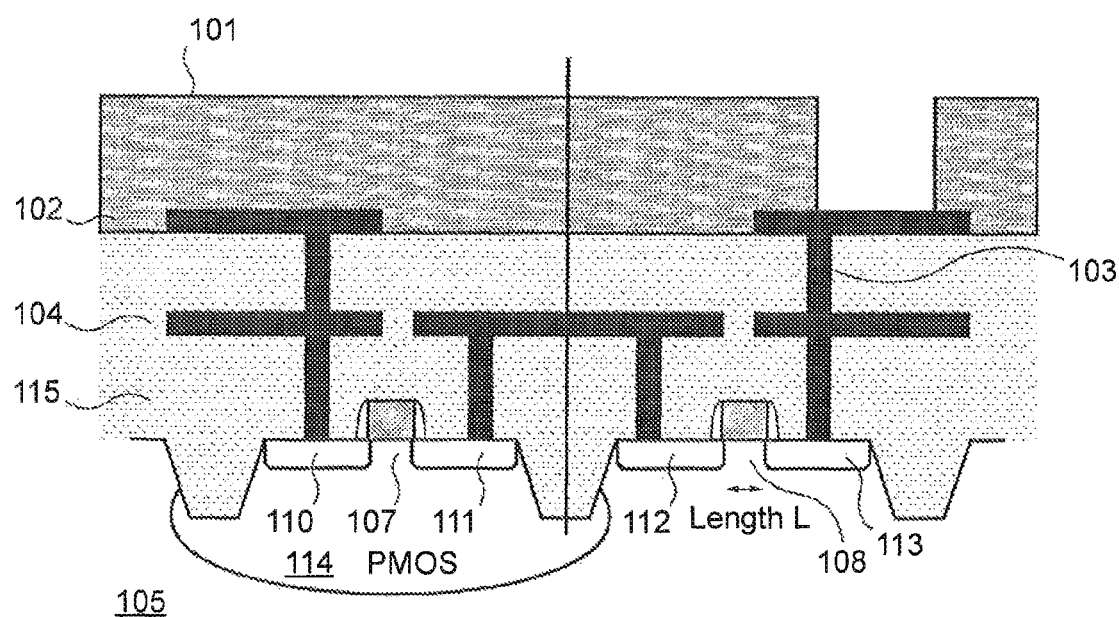
FIG. 1 represents an exemplary structure of an integrated circuit with MOS transistors, FIG. 2 schematizes the structure of a FET transistor detecting Terahertz frequencies above its transition frequency.

A general structure of an integrated circuit comprising Metal Oxyde Field Effect Transistors (MOSFETs) is illustrated in FIG. 1.

The integrated circuit comprises a P channel MOSFET (PMOS) and an N channel MOSFET (NMOS) designed in a substrate 105. The integrated circuit has a passivation layer 101 and a top metallisation layer 102. Vias 103 conduct signals from the top of the integrated circuit to the embedded metallisation layer 104. The vias connected to transistors' gates are generally not in the same plan as the two other vias. That is why the vias connected to the gates are not represented in the figure.

The PMOS and the NMOS transistors have respective gates 107 and 108. The PMOS transistor has a drain 110 and a source 111. The NMOS transistor has a source 112 and a drain 113. Isolation between the transistors is provided by a dielectric layer 115 and by a P-Well process in the zone 114.

The performance of the transistors depends on their dimensions. For example, the resistance presented by the transistors depends on the dimensions of the gates. The "length" of the gate of a transistor, usually referred to as the "length of the transistor", is noted L and is the distance between the source and drain of the transistor. The "width" of the gate, usually referred to as the "width of the transistor", is noted W and is the extension of the gate in the direction perpendicular to the cross section of the figure. Typically, the width is much larger than the length of the gate. The length of the gate affects the capability of the transistor to commute with high frequency, the larger the length, the smaller the transition frequency.

The dimensions of the channel between drain and source can be controlled through the bias voltage on the gate. As a result, the ability of the current to flow from the source to the drain can be controlled by biasing the gate. The current intensity at the drain is proportional to the ratio W/L, when expressed as a function of the voltage between the drain and the source and the voltage between the gate and the source. Thus, the resistance of the channel depends on these length and width parameters.

The integrated circuit of FIG. 1 has two horizontal layers of metal. However, integrated circuits typically have four layers and some circuits may have six layers of metallization. An increased number of metallization layers has several advantages. It makes it possible to have much more parallel horizontal connections, e.g., for reducing their resistance. It facilitates the design of inductances. It also augments the separation between the surface and the deepest metallic layer, e.g., for reducing the mutual effects of currents propagating on these layers. This may be advantageous for separating the branches of antennas of THz detection devices by disposing one branch on the top layer and the other on the bottom layer.

Detection of Terahertz waves by a field effect transistor (FET) above its transition frequency is schematically described with reference to FIG. 2.

Preferably, the waves are broadband signals with the ratio between the frequency of the carrier frequency and the baseband signal is inferior to 1000, for instance, 300 GHz/5 GHz=60.

The transistor has a source 201, a drain 203 and a metallization layer 204. The channel 205 of the transistor has a length L between the drain and the source. The channel is created when the transistor is biased. The detected wave is modelled by a voltage Ua between the transistor's gate and source which comes in addition to the biasing voltage Vg. Under some conditions on the frequency and power of the incoming wave, a voltage ΔU appears between the source and the drain. This voltage comes from the rectification of the current induced by the gas of electron of the FET.

The gate is isolated by using a layer 202 (which may be made of SiO2 or a dielectric material for example).

Figure 2:
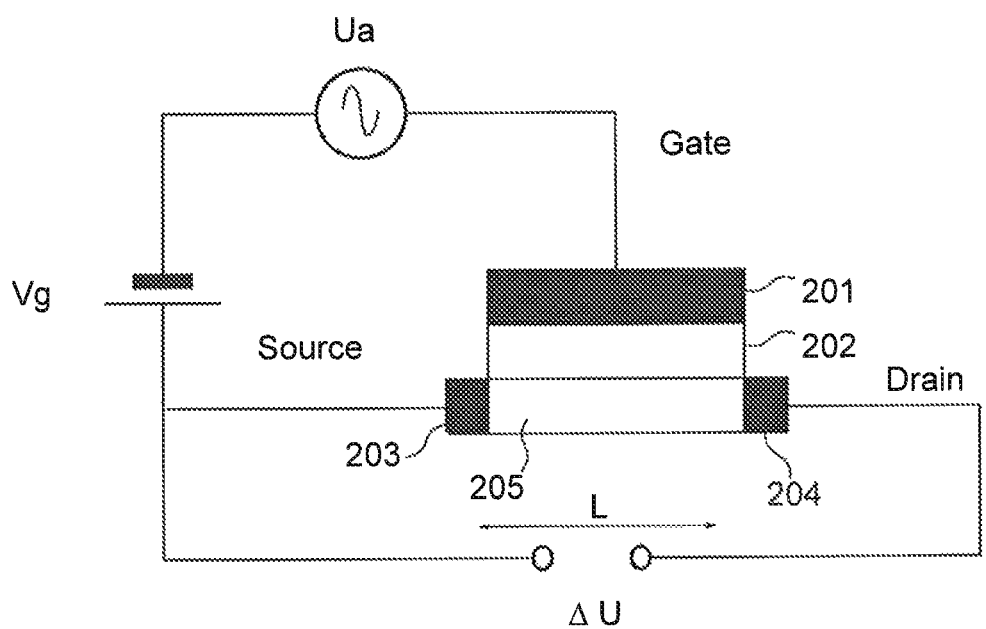
Figure 3:
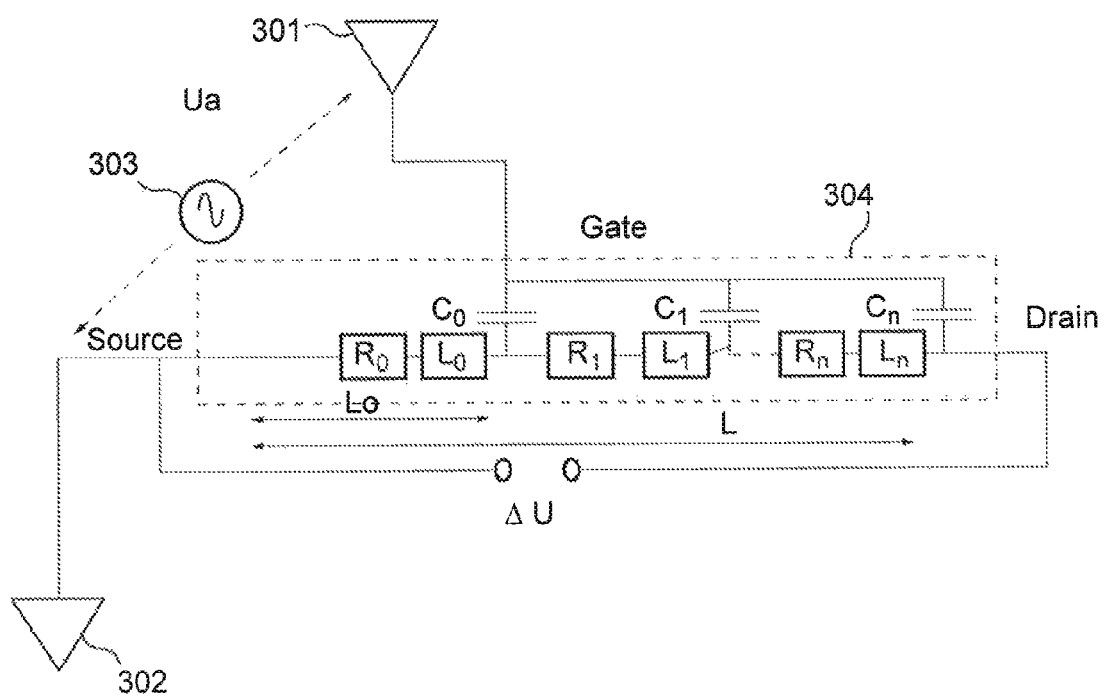
FIG. 3 represents the model of such transistor.

The transistor shown in FIG. 2, may be modelled according to the teachings of document Knap et al. *"Field Effect Transistors for Terahertz Detection: Physics and First Imaging Applications"* (Journal of Infrared, Millimeter, and Terahertz Waves, December 2009, Volume 30, Issue 12, pp 1319-1337). The model is illustrated in FIG. 3.

A first branch 301 of an antenna is connected to the gate of a FET transistor 304. A second branch 302 of the antenna is connected to the source of the transistor. The first branch 301 is the active part of the antenna and the branch 302 is the passive part of the antenna. More specifically, the second branch 302 acts as a ground that is a "counterpoise" for the antenna. An incoming Terahertz wave 303 (represented by the voltage Ua discussed hereinabove with reference to FIG. 2) excites the antenna.

The model presented here for the FET transistor is valid only for the description of the physics of a FET transistor submitted to a Terahertz wave. Gate to channel capacitances and channel resistance can be modelled as distributed capacitances $C_0, \ldots, C_n$ and resistors $R_0, \ldots, R_n$. Kinetic inductances $L_0, \ldots, L_n$, represent the carrier inertia and are proportional to the effective mass of electrons.

Depending on the frequency f of the incident terahertz wave, two regimes of operation can be distinguished. In each of these regimes, there are two cases that depend on the length of the gate L (short or long, for example depending on whether the gate is shorter than 30 nm, or longer than 0.1 μm). A low frequency regime is considered when the transistor operates at $2\pi f\tau \ll 1$ with τ being the relaxation time of the electron momentum. In this case, the plasma waves do not propagate along the entire channel, but stay close to the source.

When the gate is short, the alternative current created by the incoming wave goes through the gate to channel capacitance on the whole length of the gate. The regime is referred to as the "mixer regime".

When the gate is long, the effects differ. In this case, when the incoming wave is such that the impedance created by the distributed capacitances is equal to the impedance created by the kinetic inductances, the transistor is in a regime of damped oscillations. The plasma wave thus created is rectified by non linearities. This creates a voltage between the drain and the source. This regime of damped oscillations exists only in a small part of the transistor, close to the source.

Let Lo represent the dimension of this regime of oscillation, in other words the length of the channel wherein the oscillations are significantly present, L represent the length of the channel and R the resistance of the channel. The resistance r of the part of the channel wherein the oscillations occur is r=(R.Lo)/L. It differs from the input resistance that the FET presents at frequencies below the transition frequency ft, because it is the result of the agitation of the two dimension gas of electrons. The length of the oscillations is proportional to the square root of the concentration of carriers, in the part of the channel close to the source. Said differently, the length of the oscillations is proportional to √(τ/ω) (i.e. the square root of τ/ω) where τ is the relaxation time of the electron momentum, and w is the pulsation of the received electromagnetic wave. The relaxation time itself depends on the concentration of carriers and on the temperature.

Therefore, the transistor normally presents for signals below its transition frequency an input resistance of R and when the oscillations occur (upon detection of a THz wave), it shows a resistance r for these oscillations, above its transition frequency.

When using FET transistors and antennas as terahertz detectors, the antennas and the transistors have to be properly adapted. Impedance adaptation is first discussed with reference to FIGS. 4a-4c.

In order to draw the maximal energy available at the antenna, the antenna should be connected to its complex conjugate impedance.

Figure 4A:
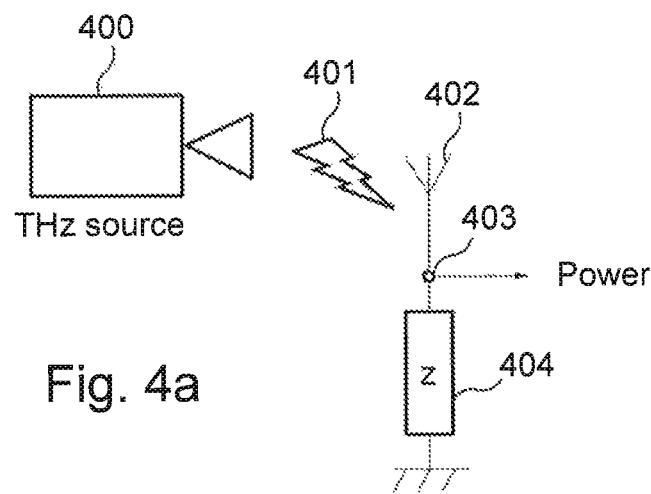
FIGS. 4a-4c illustrate a problem of adaptation of the antenna.
Figure 4B:
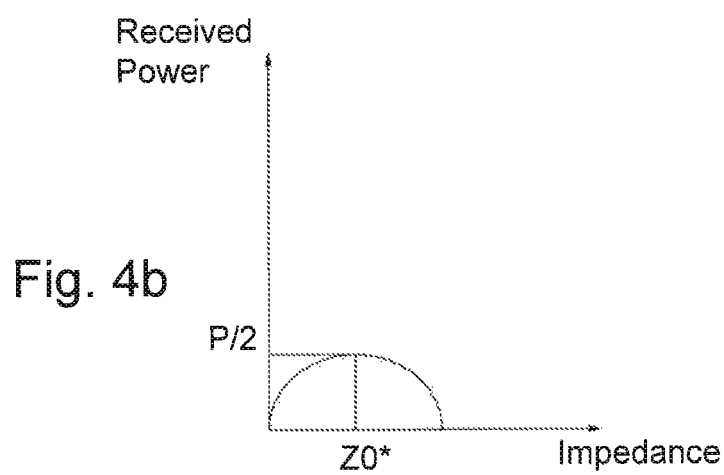

FIG. 4a schematically illustrates an antenna 402 connected to an impedance 404 of value Z. The impedance 404 is grounded. The antenna receives a THz electromagnetic wave 401 from a THz source 400. The evolution of the power received at the node 403 between the antenna and the impedance as a function of the value of the impedance is shown in FIG. 4b. The maximum of power is obtained when the impedance Z is the complex conjugate Z0* of the impedance Z0 of the antenna.

Figure 4C:
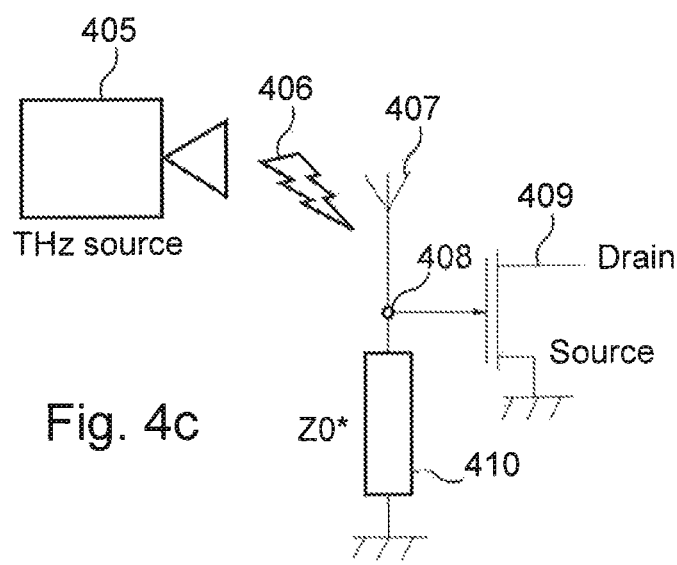

FIG. 4c shows a circuit allowing a good transfer of energy from a THz source 405 which emits an electromagnetic wave 406. The gate of a FET transistor 409 is connected to a node 408 between an antenna 407 and an impedance 410 of value Z0*, the complex conjugate of the impedance Z0 of the antenna.

The transistor may be designed to have a high impedance input r. High input impedance implies that the required transition frequency of the transistor is not necessarily high. The impedance input may be several kohms at 300 GHz.

However, in such a case, the impedance R of the channel has to be several orders of magnitude superior to the antenna's impedance (one order of magnitude is up to ten times the antenna's impedance). Thus, this should not disturb much the adaptation of the antenna to the matching circuit. Various experiments performed so far confirm this behaviour. Transistors with insufficient resistivity when in the open state must be pinched in order to maximise the detection level. This has the advantage of presenting the highest possible resistance of the transistor to the antenna junction.

In view of the above general consideration concerning impedance adaptation, the person skilled in the art would have thus expected an easy adaptation of the antenna and the detecting FET. However, the present inventors have found that this is not necessarily the case as discussed hereinbelow.

Figure 5:
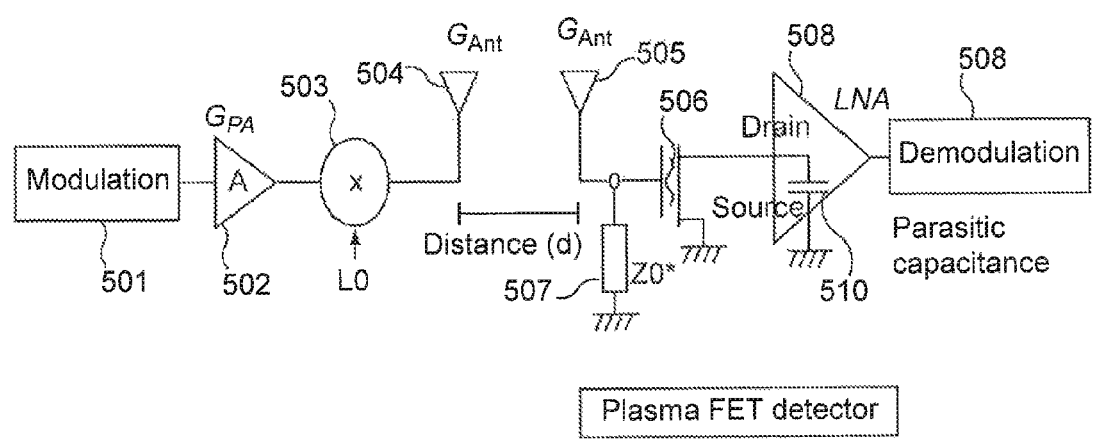
FIG. 5 illustrates a problem of the adaptation of the detector to the amplifier in the case of a demodulation system, FIG. 6 respectively illustrate an electronic device and the corresponding design process according to embodiments.

FIG. 5 illustrates a demodulating system comprising an adaptation circuit for a THz amplifier.

A baseband modulator 501 drives a buffer amplifier 502 that drives a mixer 503. The buffer 502 prevents the incoming energy from going back from the mixer 503 and also adjusts the signal level. The mixer is connected to a local oscillator that provides a frequency in the Terahertz range. The mixer thus performs a frequency transposition of the baseband signal using a carrier at a frequency $f_{osc}$ in the terahertz range. The result of the mixing is fed to the antenna 504.

At the receiver, the signal is captured by an antenna 505, which is connected to detection FET transistor 506. For the sake of conciseness, the Figure is simplified. The antenna has in fact at least two elements, one being connected to the gate of the FET, the other being connected to its source. The antenna is connected to an impedance 507 which has for value the complex conjugate of the impedance of the antenna as discussed hereinabove with reference to FIG. 4c. The detection FET transistor 506 delivers an output signal corresponding to the baseband signal.

The detection FET transistor 506 is connected to a low noise amplifier (LNA) 508, which amplifies the voltage output from the detector to a level suitable for its exploitation by a demodulation device 509.

The inventors brought into light the fact that, in such an adaptation circuit, the parasitic capacitance 510 of the LNA 508, which exists in any integrated circuit, forms with the output impedance of the FET a low pass filter, which can potentially show a cut off frequency within the signal baseband if the capacity is large enough and the output impedance is large enough.

However, the parasitic capacitance is a structural problem in the integrated circuits in general. The value of such parasitic capacitance is in the order of a few femtofarads, or even several picoFarads. Therefore, one can act only on the output impedance of the transistor to make sure that the cut-off frequency of this parasitic (and unwanted) filter is out of the frequency band of the signal.

The inventors have also brought into light a thermal noise problem.

A certain amount of power is delivered by the transmission to the transistor. This amount can be calculated by using the "Friis equation" and by adding some losses in order to take into account the impairment and uncertainties brought by the manufacturing process. This amount of power is converted into a voltage by the FET transistor.

Besides, thermal noise is also present at the input of the FET transistor. This noise is also converted by the FET transistor into a stochastic voltage. This stochastic voltage comes in addition to the thermal noise that is present at the output of the FET transistor. However, this small addition can be neglected since the power of the noise coming from the conversion of the noise voltage at the input by the FET transistor is very weak. In contrast, the power of the thermal noise present at the drain shall not be neglected. Thus, the power of the useful signal depends on the output resistance of the transistor, according the formula $P=V^2/R$. It is to be remembered that, notably in communication systems, in order to work with a defined minimum error rate, a certain signal to noise ratio (SNR) must be respected, that depends on the kind of modulation used. Therefore, if the power P becomes lower than the thermal noise power plus the SNR, then the defined minimum of error can no longer be respected. Since the THz detector converts the received power into a voltage, the final recovered power depends on the resistance R of the FET transistor.

The Friis equation gives the power at reception:

$$Pr \text{ (in dB)} = Pe \text{ (in dB)} + Gt \text{ (in dB)} + Gr \text{ (in dB)} - 20 * \log_{10}(\lambda/4\pi d),$$

wherein Gr is the antenna gain at reception, Gt is the antenna gain at transmission, Pe is the emitted power at the emitting antenna. The last term gives the attenuation due to the propagation: $\lambda$ is the wavelength and d the propagation distance. At 300 GHz, the attenuation is 20 dB at 0.8 mm, 40 dB at 8 mm and 60 db at 80 mm.

The power available at the detector output is $P=V^2/R$ with $V=a \cdot Pr$, a being a factor of conversion. The resulting SNR is P−N, wherein N is the noise calculated according to the formula 168 dBm/Hz+10*$\log_{10}$(BW) at 25 degrees Celsius (BW being the bandwidth). It must be noted that most of the noise is of thermal origin, some kind of detectors used by the inventors show in fact a small noise compared to the thermal noise.

Thus, the bandwidth has an influence on the noise. Also, as it appears from the above, in case the communication is performed through a large bandwidth, the noise is augmented. In order to keep a proper SNR, this has to be compensated by augmenting the Power P. In order to augment the power P, the value of the resistance R has to be as low as possible.

However, if the input resistance presented by the transistor is low at the carrier frequency, the use of an impedance Z as shown in FIGS. 4a-4c is no longer possible since the current from the antenna would flow to the gate of the transistor.

That is why the inventors have come to the conclusion that detecting FET transistor has to provide for the adaptation of the antenna, as the sole matching impedance attached to the antenna.

Hence, the inventors brought into light the fact that the architectures usually known to the skilled person and discussed with reference to FIGS. 4a-4c and 5 are not satisfactory.

Also, since the detection is best operated when the transistor is pinched (i.e. the channel resistance is high), they also brought into light the fact that in view of the state of the art, it seemed difficult to realize a circuit well adapted.

However, the present inventors came up with a new design of transistor that makes it possible to match the antenna's impedance.

The design takes into account the doping and channel dimensions of the transistor. The doping (i.e. the control of the number of carriers) is related to the manufacturing process. Therefore, choosing the doping depends on the process used (GaAs, Si for example). Also, the antenna and the transistor are designed in a non-independent fashion.

The general goal of a THz detector is to detect a certain carrier frequency (in the THz domain) and a certain bandwidth. The antenna's length and the transistor's length are determined in consistency in this context. Also, antenna's width and the transistor's width are determined in consistency. The antenna's impedance depends on its length and width and the transistor's impedance depends on its length and width.

The design described here combines features that would have seemed antagonistic to the skilled person.

In the prior art, the FET transistors that are used for amplification generally have dimensions adapted to obtain a good transconductance (generally showing a channel resistance in the order of several KOhms). Also, the transistors used as analogue switches present a low channel impedance when open but a very high channel impedance when pinched (turn off).

In contrast, according to embodiments, the transistor shows a matching resistance at pinch off, for the sole purpose of detection of Terahertz signals modulated with a large bandwidth.

The transistor is adapted to the antenna by adjusting its input impedance in order to detect the maximum power of the incoming electromagnetic wave. Also, the transistor's resistance is set to a minimum value.

As already discussed, the input resistance r, in the oscillation domain, can be calculated as r=R.Lo/L, with R is being the channel impedance (without oscillations). The real part of the antenna impedance dominates over the imaginary part at the frequency for which the antenna is tuned, for the sake of simplification, the transistor's impedance can also be considered a resistance. The skilled person can transpose the adaptation between resistances to the adaptation of complex impedances. This channel resistance is also the output resistance seen by the LNA, when the antenna branches are connected to the gate and to the source, and the source is connected to a common ground.

The inventors thus found that the value of L shall be close to Lo in order to satisfy both conditions. Also, they found that the transistor should be biased so that resistance R itself becomes close to the characteristic impedance of the antenna.

It has been explained hereinabove that the bandwidth of the antenna impacts the value of resistance R. Hence, the design of the FET and the antenna should be considered together.

The antenna bandwidth and the resistance of the transistor are defined by the frequency baseband of the data signal. The antenna characteristic impedance derives from the antenna's design. However, it is preferably of low value in order to design the transistor accordingly.

Preferably, the antenna should be designed to be mostly resistive (i.e. the capacitance and the inductance should be negligible) at the frequency of operation.

In view of the above, the dimensions of the transistor are determined so that the transistor can be biased in order to match the characteristic impedance of the antenna.

The length of the transistor is determined to be above Lo, which is determined by the modulation carrier frequency and by the mobility of the electron in the process. This also partly defines the resistance of the channel.

The width of the transistor is determined in order to match the impedance of the antenna.

Generally, an analog amplifying transistor has a length to width ratio of $1/10$. According to embodiments, the FET transistor has a length to width ratio of an order of magnitude higher (i.e. up to ten).

The characteristic length L0 is given by:

$$Lo = s\left(\frac{2\tau}{\omega}\right)^{1/2},$$

wherein $\tau$ is the electron momentum relaxation time, $\omega$ is the pulsation of the signal collected between the gate and source, and s is the plasma wave velocity. Lo is thus the distance from the source at which the wave amplitude is equal to 1/e, e being Euler's number (e is approximately 2.71828).

Document Knap et al. "Field effect transistors for terahertz applications" (Handbook of terahertz technology for imaging, sensing and communications, ed. By D. Saeedkia, Woodhead Publishing Series in Electronic and Optical Materials: Number 34, Woodhead Publishing Limited, 2013, p. 134), gives the following formula for the plasma wave velocity s $$s = \left(\frac{e}{m} \cdot \frac{n}{\frac{\partial n}{\partial U}}\right)^{1/2},$$

with e being the charge of the electron, m its effective mass, n the concentration of electrons in the channel, U the gate to source voltage defined by U=Ug−Uth (Ug being the gate voltage and Uth the threshold voltage of the FET).

Hence, the following formula can be obtained for Lo:

$$Lo = \left[\frac{2\mu}{\omega} \cdot \frac{1}{\frac{1}{\sigma} \cdot \frac{\partial \sigma}{\partial Ug}}\right]^{1/2},$$

wherein $\sigma$ is the conductivity in the channel, $\mu$ is the electron mobility e$\tau$/m (e being the electron charge, m its effective mass and $\tau$ the relaxation time).

This conductivity in the channel is obtained by a certain level of doping during the process of manufacturing, and is generally identical for all the transistors of the same integrated circuit.

Therefore, the conductivity dependence to the gate voltage is obtainable by measurement on a transistor that was built using the same process, by reading the dependence of the channel resistance to gate voltage—see for example document Knap et al. "Non resonant detection of terahertz radiation in field effect transistors" (J. Appl. Phys., V 91, N 11, pp. 9346-9353, 2002, p. 9349).

The photoresponse of the detector is the gate to source voltage U created when a THz electromagnetic wave reaches the transistor. It depends on the transistor's length. For a length of transistor smaller than Lo, one can approximate the photoresponse by $$dU = dU_o \cdot \frac{L}{L_o}.$$

Thus, the closer is L to Lo, the smaller the variation of the photoresponse.

The length of the transistor L is selected to be proportional to $(1/\omega)^{1/2}$. Thus, the variation dU with the frequency is:

$$dU\left(1 \pm \frac{\delta dU}{dU}\right) =$$

$$dU_o \cdot \frac{L}{L_o \cdot \left(1 \pm \frac{\delta L_0}{L_0}\right)} \approx dU_o \cdot \frac{L}{L_o} \cdot [1 \pm \delta\omega/\omega]^{1/2} = dU \cdot [1 \pm \delta\omega/\omega]^{1/2}$$

For a variation of a few GHz around 300 Ghz, i. e. $\delta\omega/\omega \ll 1$, we have:

$$(1 \pm \delta\omega/\omega)^{1/2} = 1 \pm \frac{1}{2}\delta\omega/\omega \text{ and } \frac{\delta dU}{dU} = \frac{1}{2}\delta\omega/\omega \ll 1.$$

Thus, a variation of 10 GHz (3.3%) changes the photoresponse by 1.75%.

The impedance also depends on the transistor's length.

The channel and the input resistances are proportional to L/W. Therefore, an augmentation of L has a direct effect of augmenting the resistance while an augmentation of W has a direct effect of diminishing the resistance.

In general, two resistances R1 and R2 are considered to be matched (or adapted) when the ratio |(R1−R2)/(R1+R2)| is above 10 dB. In practice, this means that a resistance can be more or less 10 Ohms below or above a matching resistance of 50 Ohms. Therefore, for the transistor, this 10% tolerance translates directly to the width and length of the transistor.

As already explained hereinabove, the impedance of the transistor when the modulated oscillations occur, for these oscillations can be approximated according to the following formula r=R.Lo/L. Thus, when designing a transistor with a length approximately equal to the length Lo of the oscillation, the impedance value can be controlled via the value R which depends on the width of the transistor. Impedance matching between the transistor and the antenna can thus be performed by selecting the appropriate width for lowering the impedance and providing large band reception. Advantageously, increasing the width of the transistor enhances the detection and the resulting voltage available at the drain.

Figure 6:
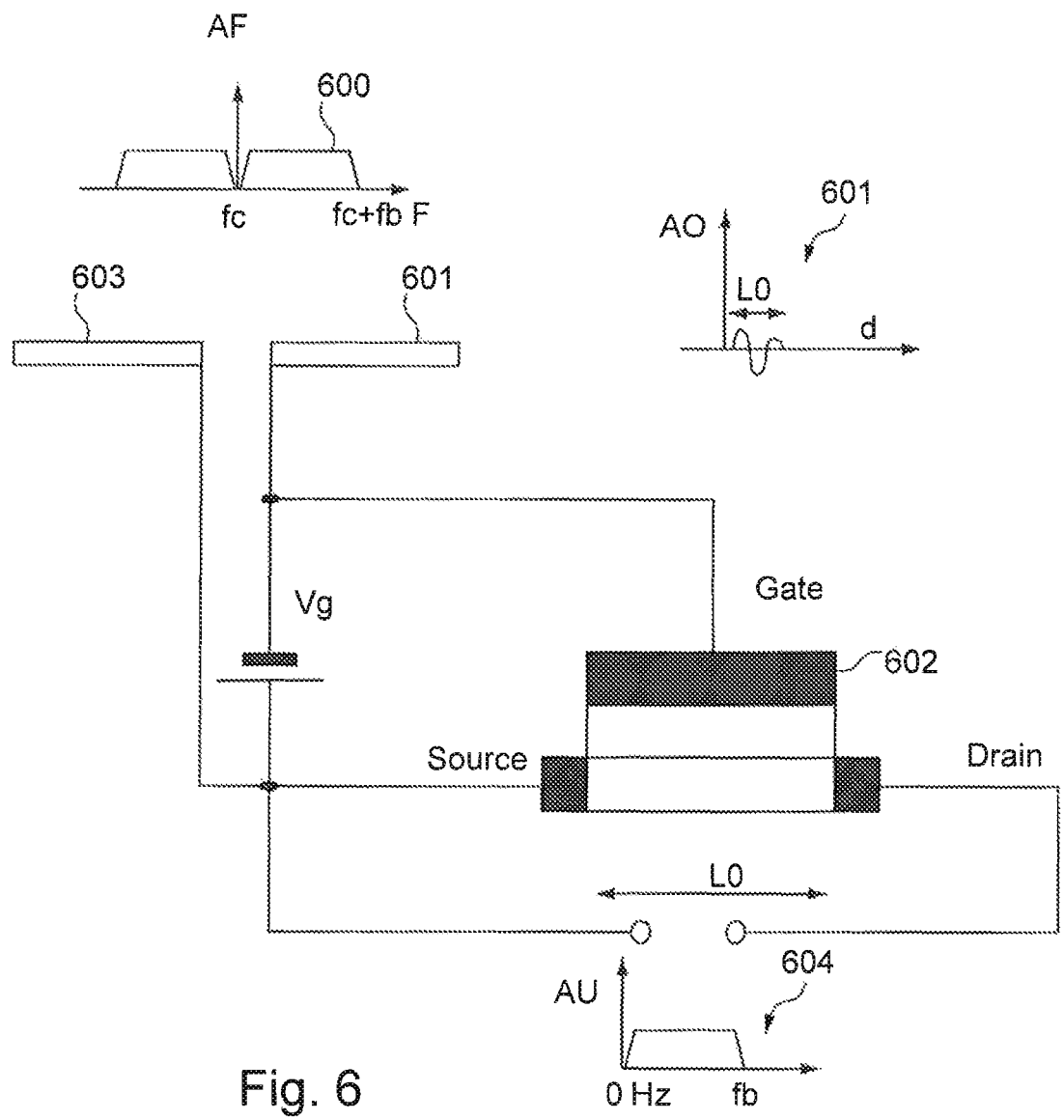

FIG. 6 illustrates a use case according to embodiments.

A modulated signal 600 having a spectrum around a carrier frequency fc with a bandwidth fb is received through an antenna branch 601. The antenna branch is connected to a gate of a FET transistor 602. The transistor is biased between its gate and its source by a voltage Vg so that the transistor is in the dampened oscillation regime when THz waves reach the antenna. An antenna branch 603 is connected to the source of the transistor in order to provide a counterpoise.

The transistor is designed so that it has a length in proportion to the characteristic length of the oscillation regime as illustrated in graph 605. The characteristic length is also determined based on the carrier frequency and the bandwidth so that the voltage appearing in the oscillation regime between the source and the drain has a frequency within the bandwidth fb as illustrated by the graph 604.

Figure 7:
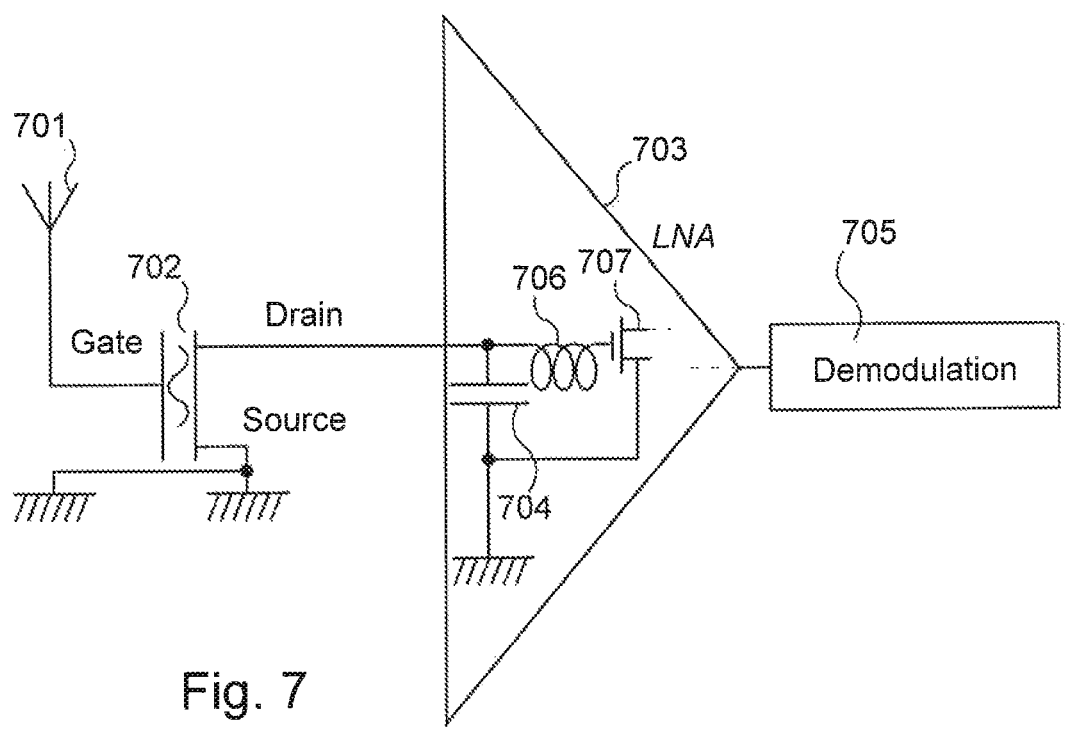
FIGS. 7-8 schematically illustrate embodiments of a demodulation system.

FIG. 7 illustrates an example of a demodulation system comprising an embodiment of an electronic device according to embodiments. The device according to embodiments is particularly suitable for this application.

An antenna 701 is connected to the gate of a FET transistor 702. The drain of the transistor is connected to a low noise amplifier (LNA) 703 to deliver the baseband signal (see FIG. 5). The source of the transistor is grounded. The LNA comprises a capacitance 704 connected between the drain of the transistor 702 (i.e. the input of the LNA) and the ground. The capacitance may represent the parasitic capacitance inherent to the process and the capacitance of a matching network. In general terms, a matching network is a network of capacitances and inductances for bringing the input impedance of a circuit to a given resistive impedance (50 Ohms generally).

The LNA also comprises an inductance 706 connected between the drain of the transistor 702 (i.e. the input of the LNA) and the gate of an amplifying transistor 707. The inductance may be part of the matching network.

The other elements of the LNA are not represented for the sake of conciseness. The skilled person is believed to be able to refer to the prior art for a detailed structure on an LNA.

As compared with the circuit of FIG. 5, there is no adaptation impedance between the antenna and the transistor. According to the invention, the transistor is designed to provide an input impedance adapted to the antenna. The circuit further comprises a demodulation module 705 for demodulating the signal received through the antenna.

Figure 8:
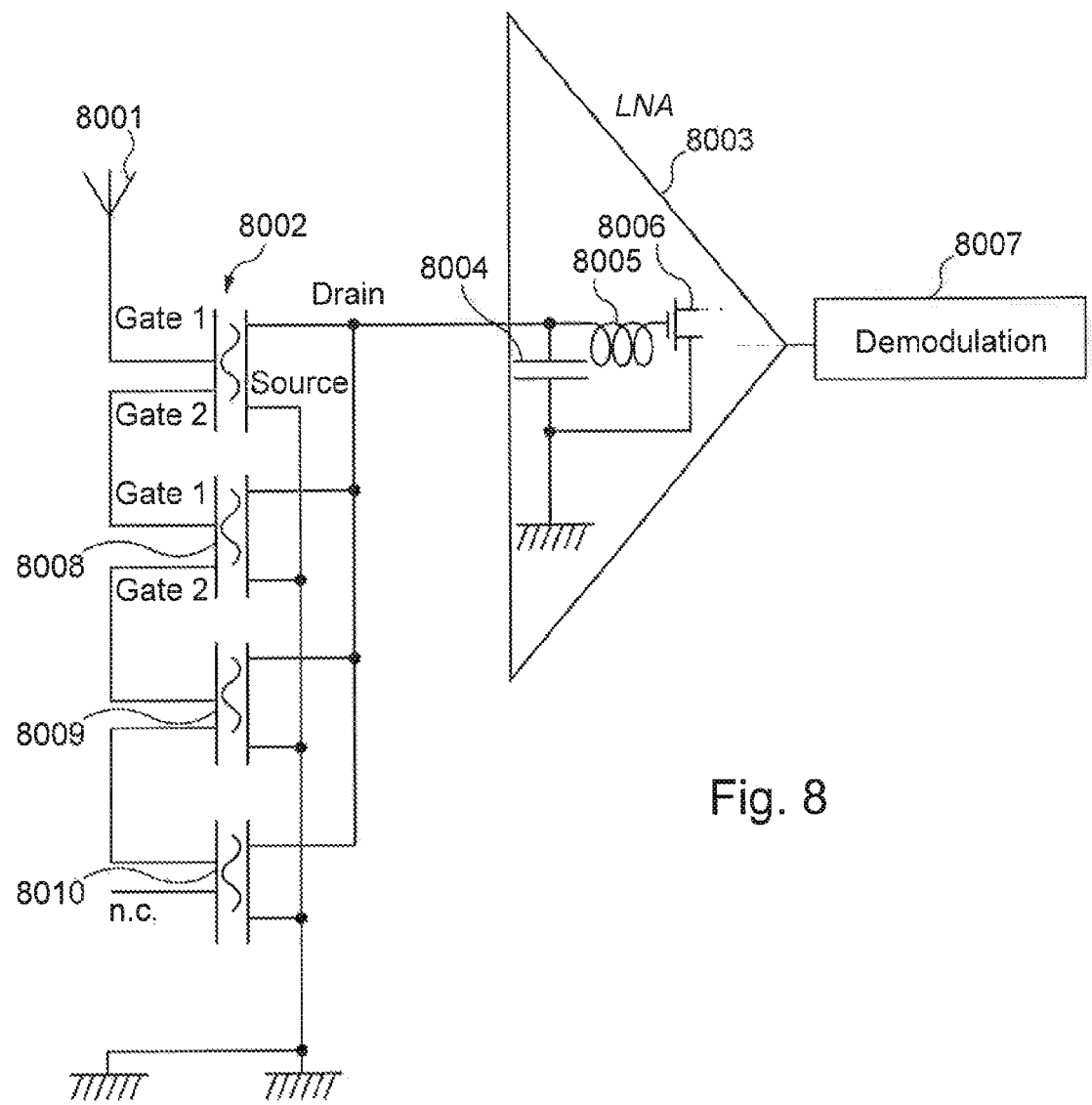

FIG. 8 illustrates a variant wherein the transistor is replaced by a series of transistors connected in parallel.

An antenna 8001 is connected to a gate of a first FET transistor 8002. The drain of the transistor is connected to a low noise amplifier (LNA) 8003 to deliver the baseband signal (see FIG. 5). The source of the transistor is grounded. The LNA comprises a capacitance 8004 connected between the drain of the transistor 8002 (i.e. the input of the LNA) and the ground. The capacitance may represent the parasitic capacitance inherent to the process and the capacitance of a matching network. In general terms, a matching network is a network of capacitances and inductances for bringing the input impedance of a circuit to a given resistive impedance (50 Ohms generally).

The LNA also comprises an inductance 805 connected between the drain of the transistor 8002 (i.e. the input of the LNA) and the gate of an amplifying transistor 8006. The inductance may be part of the matching network.

The other elements of the LNA are not represented for the sake of conciseness. The skilled person is believed to be able to refer to the prior art for a detailed structure on an LNA.

The circuit further comprises a demodulation module 8007 for demodulating the signal received through the antenna.

The circuit further comprises a transistor 8008 which has a gate connected to a gate of transistor 8002, its source is connected to the source of transistor 802 and its drain is connected to the drain of transistor 8002.

The circuit further comprises a transistor 8009 which has a gate connected to the gate of transistor 8002, its source is connected to the source of transistor 8002 and its drain connected to the drain of transistor 8002.

The circuit further comprises a transistor 8010 which has a gate connected to the gate of transistor 8002, its source connected to the source of transistor 8002 and its drain connected to the drain of transistor 8002.

The number of FET transistors may vary but a compromise must be found between the number of transistor, the capacitance this number introduces and the resulting impedance of the transistors.

The FET transistor may have a double gate. One gate (Gate 1) of transistor 8002 can be connected to the antenna while the other gate (Gate 2) is connected to one gate (Gate 1) of transistor 8008. The other gate (Gate 2) of transistor 8008 can be connected to one gate of transistor 8009. The other gate of transistor 8009 can be connected to one gate of transistor 8010. Since transistor 8010 is the last of the chain of transistors, the other gate of this transistor can remain unconnected (n.c.).

In what follows, numerical examples are given for the design of the transistor.

First, the example of a transistor with limitations due to the manufacturing process is given.

For example, a family of MOS transistors in 350 nm has transistors of dimensions L=1 μm and W=8 μm. The characteristics are at Vds=5 mV, R=2,2604 MOhms for Vgs=0.75 and R=1.74 KOhms for Vgs=1.5 V.

For example, we have:
$\partial\sigma/\partial Ug = 7.65 \times 10^{-4}$ S/m/V. This data may be given by the manufacturer of the transistor. It may also be measured.

At Vgs=1.5V and f=300 GHz, given the formula already given herein above we have:

$$Lo = \left[\frac{2 \times 0.05}{2 \cdot \pi \cdot 300 \cdot 10^9} \cdot \frac{1}{1.74 \times 10^3 \times 7.65 \cdot 10^{-4}}\right]^{1/2} = 199 \text{ nm}.$$

Therefore, Lo is in the same order of magnitude than the length of the transistor (the ratio between L and L0 is less than ten).

The input resistance when a THz wave is detected is directly obtained for the transistor: 1740 Ohms×Lo/L, so for a transistor of L=1 μm and W=8 μm, this gave 346 Ohms.

The 350 nm technology does not allow a gate length below 380 nm. For the minimum length in this technology (L=380 nm), the resistance is 911 Ohms.

Now the width of the transistor so defined must be enlarged 19 times to change 911 Ohms into 50 Ohms (for an antenna having a 50 ohms impedance and 911/50=18.2). Hence, in this technology, a transistor of L=380 nm and W=152 μm (8 μm×19=152 μm) presents an impedance of 50 ohms to the antenna and an impedance of (L/Lo)×50 Ohms at the output, that is 95 Ohms.

Assuming the input capacitance of the amplifier is (as an example) pF, the bandwidth will be limited to 1.67 GHz (considering the cut off frequency ½πRC of an RC filter, ½π×95×1 pF=1.67 GHz).

For a conservative conversion factor of the FET of 10 V/W over a 95 Ohms we get a power conversion factor of −30 dBm for a noise of −76 dBm. This allows for a minimum budget link of −46 dB to maintain a 10 dB SNR ratio that is sufficient to provide a BER lower than 10-6 with a BPSK modulation. A budget link is the accounting of all of the gains and losses from the transmitter, through the medium to the receiver in a telecommunication system.

In what follows, the example of a transistor with limitations due to the manufacturing process is given.

A family of GaAs transistors comprises transistors of dimensions L=0.15 μm and W=50 μm. The characteristics are at Vds=−0.5 V, R=1250 Ohms for Vgs=0.25V and R=263 Ohms for Vgs=−0.25 V.

For example, we have $\partial\sigma/\partial Ug = 1.2 \times 10^{-2}$ S/m/V.

At Vgs=−0.5 V and f=300 GHz, given the formula already given herein above we have:

$$Lo = \left[\frac{2 \times .2}{2 \cdot \pi \cdot 300 \cdot 10^9} \cdot \frac{1}{1250 \times 1.2 \cdot 10^{-2}}\right]^{1/2} = 118 \text{ nm}.$$

Thus, the resistance r is 1250*118/150=983 Ohms. With a bias voltage value of Vgs=−0.5, in order to match a 50 Ohm impedance, the width should be enlarged 20 times to reach 1 mm (for an antenna having a 50 Ohms impedance and 983/50=19.66). In order to present a resistance of 50 Ohms, the transistor can be designed with a 120 nm length, which is compatible with state of the art manufacturing processes.

The Vg voltage can also be adjusted so that length Lo is equal to 150 nm, which is the case for Vgs #−0.35 V. This can be determined using a manufacturer's abacus. However, with such value, the resistance is 770 Ohms and the transistor must be enlarged by a factor of 16 (770/50=15.4). The transistor detects electromagnetic waves better when the voltage is close to the close to the pinch-off voltage. Therefore, a displacement of Vgs reduces the factor of conversion. This advocates for a preferable enlargement of 20.

Assuming the input capacitance of the amplifier is (as an example) 1 pF, the bandwidth will be limited to 3.1 GHz (considering the cut off frequency ½πRC of an RC filter, 1/(2π×50×1 fF)=3.1 GHz).

For a conversion factor of the FET of 10 V/W (ratio between the power of the wave received and the output voltage) with a 50 Ohms impedance, a power conversion factor of −33 dBm can be obtained for a noise of −74 dBm. This makes it possible to lower the link budget of −41 dB to maintain a 10 dB SNR ratio that is sufficient to provide a BER lower than $10^{-6}$ with a BPSK modulation. Bias of Vgs and Vds is important, and is implicitly required by the equations. Such biases can be applied using the following principle principles described in GB 1313912.6, from the same authors. The principle is to use both ends of the gate finger, one being attached to the antenna and the other carrying a device (a stub, for example) creating a virtual ground for the AC signal, which can then be used to feed the DC bias. This way is easier than trying to use the antenna's virtual ground, which is theoretically a point or a line.

Figure 9:
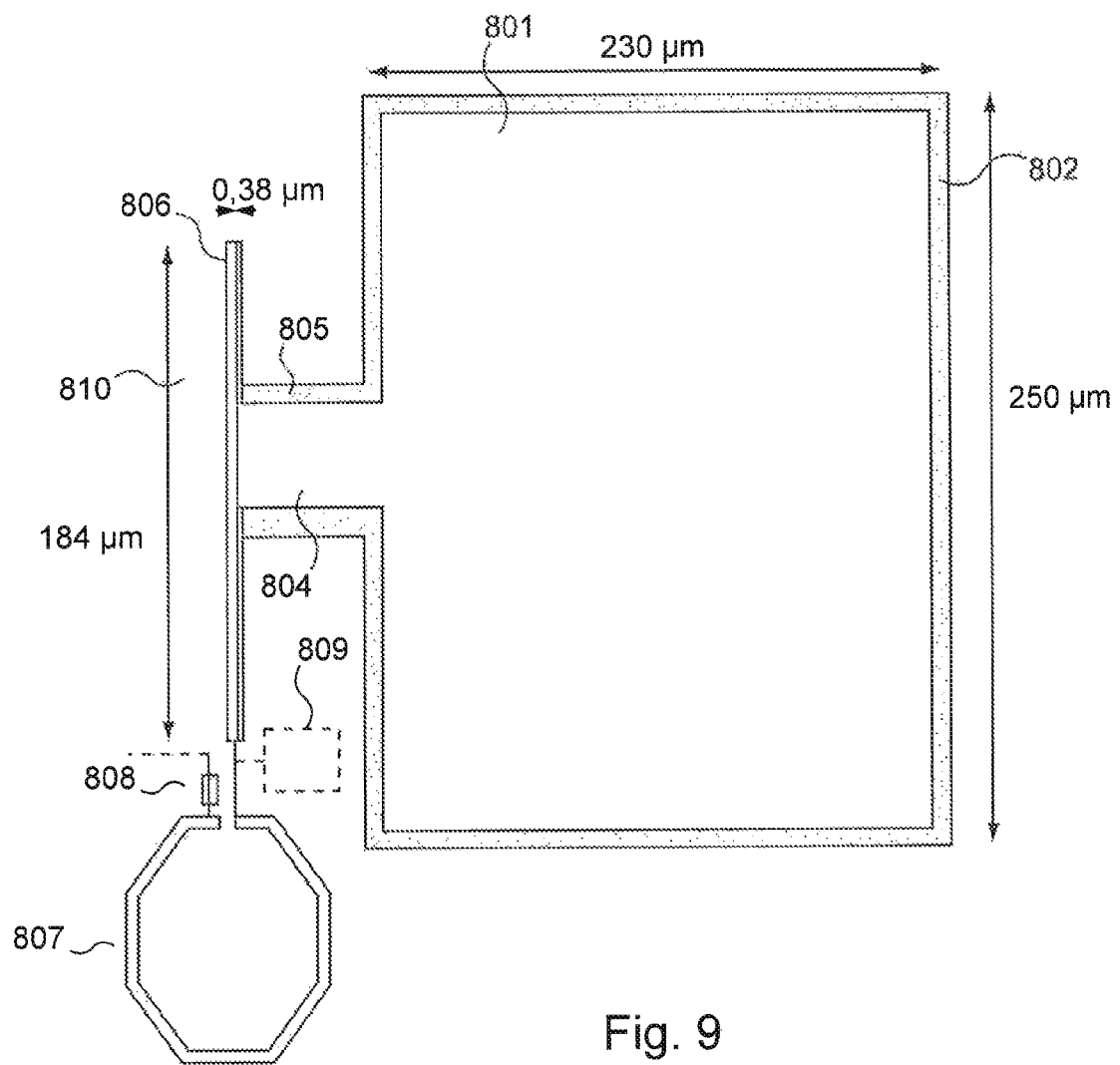
FIGS. 9-11 schematically illustrate circuit layouts according to embodiments.

FIG. 9 schematically represents the circuit layout of an integrated circuit, according to embodiments. The layout is viewed from the top. The figure is not to scale. This figure shows the specific design of a transistor incorporated in an electronic device according to embodiments compared to a standard JFET transistor 808.

A patch 801 forms the active part of the antenna. The patch may be formed on the upper metallic layer. Another metallic layer supports the ground counterpoise 802 for the patch antenna 801.

For example, the patch antenna presents a resistance around 40 Ohms. The width of a transistor 810 according to the invention, assuming its length to be 380 nm, shall be enlarged 23 times to 184 μm (911 Ohms/40 Ohms, the resistance of a 380 nm length divided by the impedance of the antenna) The layout of this transistor is represented by a long rectangle, the gate being represented by a small line inside the rectangle. This illustrates the overall shape of the transistor.

The transistor could be placed below the antenna ground using vias. This spares space in case more than two layers of metallization are available. The layout of FIG. 7 has only two layers for the sake of conciseness.

Element 805 is the metal link between the source 806 of the transistor and the ground. Element 804 is the metal link between the active part of the antenna and the gate of the transistor. The layout of some of the components of a low noise amplifier (LNA) is also represented. Element 809 is a capacitance (corresponding to capacitance 704 in FIG. 6). Element 807 is the layout of one turn of an inductance (corresponding to the inductance 706 in FIG. 6) and element 808 is the layout of an amplifying transistor (corresponding to 707 in FIG. 6). This transistor works at frequencies below its transition frequency. Generally, such analog amplifying transistor (well-known standard transistor) has a length versus width ratio of 1/10, so it appears comparatively smaller than the detecting transistor according to embodiments. It must be noted that if the carrier frequency augments, the gate of the detecting transistor will become smaller, the dimension of the antenna will become smaller, but this analog amplifying transistor needs not to be modified.

As an alternative to reducing the detecting transistor's width, it may be possible to connect several transistors in a parallel manner, drains tied to drains, source tied to sources, gates to gates. However, in this solution parasitic capacitances will also augment.

Figure 10:
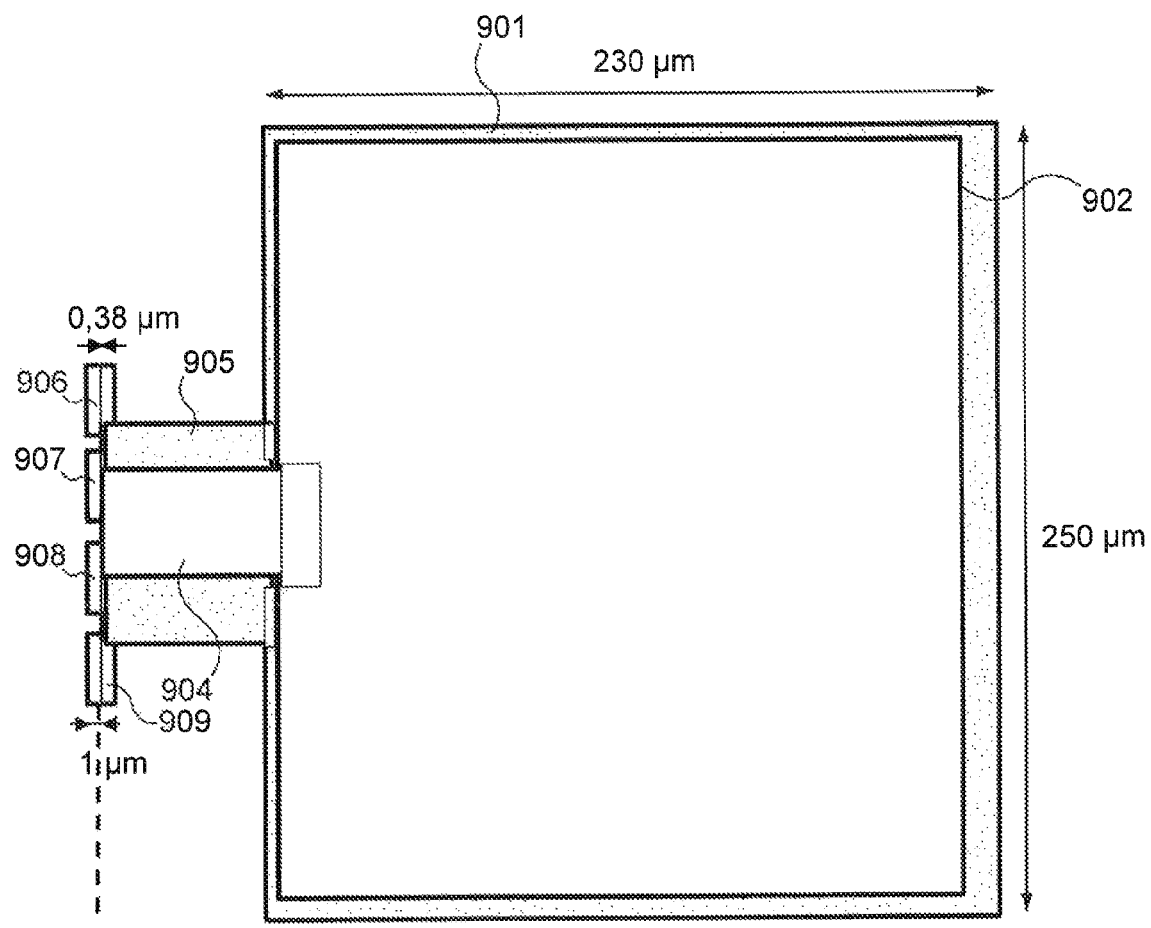

FIG. 10 schematically illustrates a circuit layout with a plurality of detecting transistors as discussed with reference to FIG. 8. FIG. 10 is not to scale for the sake of conciseness.

A patch 902 forms the active part of an antenna. The patch may be disposed on the upper metallic layer of the circuit. Another metallic layer supports a ground counterpoise 901 for the patch antenna 902.

As compared to the circuit of FIG. 8, the detecting transistor is replaced by four transistors 906, 907, 908, 909. The number of transistor can be different but a compromise must be found between the number of transistor, the capacitance this number introduces and the resulting impedance of the transistors.

Element 905 is the metal link between the source of the transistors and the ground. Element 905 is bigger than the link shown in FIG. 8 because it has to cover the plurality of transistors. However, this increases the capacitance it introduces in the circuit. Element 904 is the metal link between the active part of the antenna and the gate of the transistor.

A way to facilitate this implementation is also to use a double gate transistor and to connect one of the gate of the transistor to the alternate gate of the other transistor. For the sake of conciseness, the LNA elements are not represented.

Figure 11:
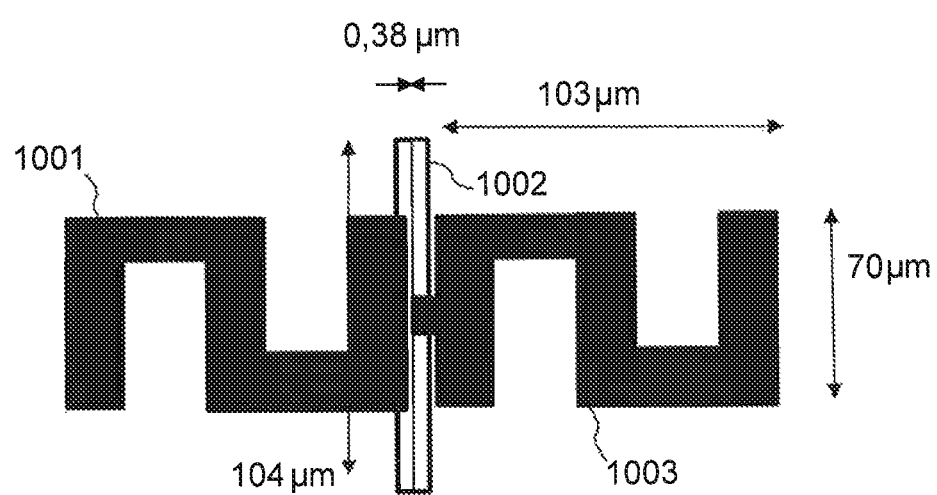

FIG. 11 shows another exemplary layout according to embodiments.

The layout is shown from the top and the figure is not to scale.

An antenna is made of two folded lines 1001 and 1003 forming the branches of the antenna. One branch is connected to the source of a transistor 1002 and the other branch is connected to the gate of the transistor. The LNA is not represented.

This kind of antenna usually presents a resistance around 72 Ohms. If the transistor has a length of 380 nm, its width is to be enlarged 13 times to 104 μm. (911 Ohms/73 Ohms). In such design, the width of the antenna is defined by its bandwidth and its carrier frequency is defined by the length.

While the invention has been illustrated and described in detail in the drawings and foregoing description, such illustration and description are to be considered illustrative or exemplary and not restrictive, the invention being not restricted to the disclosed embodiment(s). Other variations to the disclosed embodiment(s) can be understood and effected by those skilled in the art in practicing the claimed invention, from a study of the drawings, the disclosure and the appended claims.

In the claims, the word "comprising" does not exclude other elements or steps, and the indefinite article "a" or "an" does not exclude a plurality. The mere fact that different features are recited in mutually different dependent claims does not indicate that a combination of these features cannot be advantageously used. Any reference signs in the claims should not be construed as limiting the scope of the invention.

The invention claimed is:

1. An electronic device for receiving at least one electromagnetic wave of a given frequency, the electronic device comprising:
   at least one first field effect transistor, and
   at least one antenna configured to receive the at least one electromagnetic wave and connected to a gate of the at least one first field effect transistor,
   wherein
   a length of the gate is in a same order of magnitude as an oscillation length of an oscillation regime of the at least one first field effect transistor at the given frequency, and
   a width of the gate is such that an impedance presented by the at least one first field effect transistor in the oscillation regime is adapted to an impedance of the at least one antenna.

2. The electronic device according to claim 1, wherein the at least one first field effect transistor is a plasmonic transistor and the oscillation regime of the at least one first field effect transistor corresponds to the plasma movements.

3. The electronic device according to claim 1, wherein the length of the gate is above the oscillation length.

4. The electronic device according to claim 1, wherein the length of the gate minimizes a variation of a photoresponse of the at least one first field effect transistor.

5. The electronic device according to claim 4, wherein the variation is below 50%.

6. The electronic device according to claim 1, wherein the impedance is set to a minimum value in order to maximise a working frequency bandwidth of the electronic device and in order to minimize a signal to noise ratio of the electronic device.

7. The electronic device according to claim 1, further comprising at least one other second field effect transistor, a length of a gate of the at least one other second field effect transistor being below the length of the gate of the at least one first field effect transistor.

8. The electronic device according to claim 1, wherein a source of the at least one first field effect transistor is grounded.

9. The electronic device according to claim 1, further comprising a plurality of the at least one first field effect transistors connected in parallel.

10. The electronic device according to claim 9, wherein the plurality of the at least one first field effect transistors are double gate transistors.

11. The electronic device according to claim 1, further comprising a low noise amplifier connected to the at least one first field effect transistor.

12. The electronic device according to claim 11, wherein the low noise amplifier presents an input capacitance and wherein the value of the impedance presented by the at least one first field effect transistor is such that a cut-off frequency of a low-pass filter formed at least by the impedance and the capacitance is above working frequencies of the electronic device.

13. The electronic device according to claim 11, wherein the low noise amplifier is connected to a drain of the at least one first field effect transistor.

14. A demodulation system comprising:
an electronic device for receiving at least one electromagnetic wave of a given frequency, the electronic device comprising:
at least one first field effect transistor, and
at least one antenna configured to receive the at least one electromagnetic wave and connected to a gate of the at least one first field effect transistor, wherein
a length of the gate is in a same order of magnitude as an oscillation length of an oscillation regime of the at least one first field effect transistor at the given frequency, and
a width of the gate is such that an impedance presented by the at least one first field effect transistor in the oscillation regime is adapted to an impedance of the at least one antenna; and
a demodulator for demodulating the at least one electromagnetic wave.

15. The demodulation system according to claim 14, wherein the demodulator is connected to a low noise amplifier connected to the at least one first field effect transistor.

16. A method of manufacturing an electromagnetic wave detector device, the method comprising:
determining at least one working frequency for the electromagnetic wave detector device,
determining an oscillation length of an oscillation regime at the at least one working frequency of at least one transistor to be integrated in the electromagnetic wave detector device,
determining an antenna impedance of at least one antenna to be integrated in the electromagnetic wave detector device,
disposing at least one antenna layer in an integrated circuit in order to form the at least one antenna to be integrated in the electromagnetic wave detector device,
disposing at least one gate layer of the at least one transistor to be integrated in the electromagnetic wave detector device, wherein a length of a gate of the at least one transistor is in a same order of magnitude as the oscillation length and a width of the gate such that an impedance presented by the at least one transistor in the oscillation regime is adapted to the antenna impedance of the at least one antenna, and
connecting the at least one antenna layer to the at least one gate layer.

* * * * *